(12) United States Patent
Kuwazawa et al.

(10) Patent No.: US 9,818,790 B2
(45) Date of Patent: Nov. 14, 2017

(54) SOLID-STATE IMAGING DEVICE AND MANUFACTURING METHOD THEREOF

(71) Applicant: SEIKO EPSON CORPORATION, Tokyo (JP)

(72) Inventors: Kazunobu Kuwazawa, Sakata (JP); Noriyuki Nakamura, Sakata (JP); Mitsuo Sekisawa, Sakata (JP); Takehiro Endo, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/070,574

(22) Filed: Mar. 15, 2016

(65) Prior Publication Data

US 2016/0276390 A1 Sep. 22, 2016

(30) Foreign Application Priority Data

Mar. 19, 2015 (JP) .................................. 2015-055694

(51) Int. Cl.
*H01L 27/146* (2006.01)

(52) U.S. Cl.
CPC .. *H01L 27/14643* (2013.01); *H01L 27/14607* (2013.01); *H01L 27/14612* (2013.01); *H01L 27/14616* (2013.01); *H01L 27/14689* (2013.01)

(58) Field of Classification Search
CPC ......... H01L 27/14643; H01L 27/14607; H01L 27/14612
See application file for complete search history.

(56) References Cited

U.S. PATENT DOCUMENTS 6,690,423 B1 * 2/2004 Nakamura ........ H01L 27/14601
257/215
7,042,061 B2 5/2006 Nakamura et al.
7,224,003 B2 5/2007 Nakamura et al.
(Continued)

FOREIGN PATENT DOCUMENTS

JP H03-261172 A 11/1991
JP H04-99878 A 3/1992
(Continued)

OTHER PUBLICATIONS

Inoue et al; "New LV-BPD (Low Voltage Buried Photo-Diode) for CMOS Imager;" 1999; IEDM; 4 pp.

*Primary Examiner* — Errol Fernandes
(74) *Attorney, Agent, or Firm* — Oliff PLC

(57) ABSTRACT

A solid-state imaging device includes a P-well, a gate insulating film, a gate electrode, a $P^+$-type pinning layer that is located in the P-well so as to be outside the gate electrode and start from a first end portion of the gate electrode, a $P^-$-type impurity region that is located in the P-well so as to extend under the gate electrode from a first end portion side and be in contact with the pinning layer, an $N^-$-type impurity region that is located in the P-well so as to extend under the pinning layer and the $P^-$-type impurity region and be in contact with the $P^-$-type impurity region and the gate insulating film, and an $N^+$-type impurity region that is located in the P-well and includes a portion that is under a second end portion of the gate electrode.

8 Claims, 13 Drawing Sheets

(56) References Cited

U.S. PATENT DOCUMENTS

| | | | |
|---|---|---|---|
| 7,846,758 B2 * | 12/2010 | Ohkawa | H01L 27/14601 257/431 |
| 8,169,523 B2 | 5/2012 | Itonaga | |
| 8,593,553 B2 | 11/2013 | Itonaga | |

FOREIGN PATENT DOCUMENTS

| | | |
|---|---|---|
| JP | H11-274450 A | 10/1999 |
| JP | 3403061 B2 | 5/2003 |
| JP | 3600430 B2 | 12/2004 |
| JP | 2010-219563 A | 9/2010 |

\* cited by examiner

SOLID-STATE IMAGING DEVICE AND MANUFACTURING METHOD THEREOF

BACKGROUND

1. Technical Field

The present invention relates to solid-state imaging devices and manufacturing methods thereof.

2. Related Art

Heretofore, CCD sensors have been mainly used in solid-state imaging devices. However, development of CMOS sensors that can be driven at a low voltage and on which a peripheral circuit can be incorporated has been progressing rapidly. Countermeasures against noise that include process measures such as complete transfer technology and a dark current prevention structure and circuit measures such as CDS have been applied to the CMOS sensors, and as a result the image quality thereof has become comparative to that of the CCD sensors. Now the CMOS sensors exceed the CCD sensors in quality and in production volume. The rapid advancement of the CMOS sensors is attributed to a large improvement in image quality, and the improvement in image quality was realized by an improvement in charge transfer techniques and the like. Technologies for improving charge transfer techniques are disclosed in Japanese Patents No. 3,403,061 and No. 3,600,430.

FIG. 12A is a cross-sectional view illustrating a known solid-state imaging device, and FIG. 12B is a potential diagram when charges are transferred from X to Y shown in FIG. 12A in the case where a transfer gate is on and off.

The solid-state imaging device shown in FIG. 12A includes an N-type silicon substrate 101 and a P-well (P$^{--}$) 102 formed in the N-type silicon substrate 101. A gate insulating film 106 is formed on the P-well 102, and a transfer gate electrode 107 is formed on the gate insulating film 106. A pinning layer (P$^+$) 104 is formed in the P-well 102 so as to be outside the transfer gate electrode 107 and start from a first end portion 107a thereof in plan view. A diffusion layer of an N$^-$-type impurity region 103 is formed in the P-well 102 so as to extend under the pinning layer 104. A diffusion layer of an N$^+$-type impurity region (floating diffusion) 105 is formed in the P-well 102 in a portion that includes a portion that is under a second end portion 107b of the transfer gate electrode 107.

In the known solid-state imaging device described above, a structure has been adopted in which the N$^-$-type impurity region 103 that includes a portion under the first end portion 107a of the transfer gate electrode 107 and constitutes a photodiode extends under the transfer gate electrode 107. This structure is the main factor for avoiding the formation of a transfer barrier. However, in this structure, when the extension amount of the N$^-$-type impurity region 103 under the transfer gate electrode 107 becomes too large, a problem arises in that a potential well (dip) is formed. In this case, a problem arises in that, when a charge transfer 108 is performed, charges are trapped in the potential well, and a charge transfer failure occurs (refer to FIG. 12B).

On the other hand, in the case where the extension amount of an N$^-$-type impurity region 103a under the transfer gate electrode 107 is small, as shown in FIG. 13A, a problem arises in that a charge transfer failure occurs due to a potential barrier (refer to FIG. 13B). FIG. 13A is a cross-sectional view illustrating another known solid-state imaging device, and FIG. 13B is a potential diagram when charges are transferred from X to Y shown in FIG. 13A in the case where a transfer gate is on and off. The solid-state imaging device shown in FIG. 13A differs from the solid-state imaging device shown in FIG. 12A in that the extension amount of the N$^-$-type impurity region 103a under the transfer gate electrode 107 is almost zero, and other configurations are the same.

As described above, it has been difficult to control the extension amount of the N$^-$-type impurity region 103 or 103a under the transfer gate electrode 107 such that the potential well (refer to FIG. 12B) and the potential barrier (refer to FIG. 13B) are not formed. Specifically, it has been difficult to realize a structure, with high controllability, with which the potential well and the potential barrier are prevented from forming when the charge transfer is performed at a low voltage.

SUMMARY

Some aspects of the invention relate to solid-state imaging devices in which generation of a potential well and a potential barrier can be suppressed when a charge transfer is performed and manufacturing methods of the solid-state imaging devices.

An aspect of the invention is a solid-state imaging device including: a first conductivity type semiconductor layer; a gate insulating film located on the semiconductor layer; a gate electrode located on the gate insulating film; a first conductivity type first impurity region that is located in the semiconductor layer so as to be outside the gate electrode and start from a first end portion of the gate electrode in plan view; a first conductivity type second impurity region that is located in the semiconductor layer so as to extend under the gate electrode from the first end portion side and be in contact with the first impurity region; a second conductivity type third impurity region that is located in the semiconductor layer so as to extend under the first impurity region and the second impurity region and be in contact with the second impurity region and the gate insulating film; and a second conductivity type fourth impurity region that is located in the semiconductor layer and includes a portion that is under a second end portion of the gate electrode. The first impurity region, the second impurity region, the third impurity region, and the semiconductor layer are located in the stated order from the outside of the gate electrode on the first end portion side toward the second end portion of the gate electrode in plan view, and impurity concentration in the first impurity region, the second impurity region, and the semiconductor layer decreases in the stated order.

According to the above aspect of the invention, generation of a potential barrier when a charge transfer is performed can be suppressed, because the third impurity region is in contact with the gate insulating film. Also, generation of a potential well when a charge transfer is performed can be suppressed, because the semiconductor layer extends under the gate electrode from the first end portion side.

Also, an aspect of the invention is a solid-state imaging device wherein the second impurity region includes a portion that is located under the first impurity region.

Also, an aspect of the invention is a solid-state imaging device wherein the second impurity region does not exist outside of the gate electrode from the first end portion in plan view.

Also, an aspect of the invention is a solid-state imaging device wherein the semiconductor layer is a first conductivity type well, and the first conductivity type well is located in a semiconductor substrate.

Also, an aspect of the invention is a solid-state imaging device wherein the semiconductor layer is a first conductivity type semiconductor substrate.

An aspect of the invention is a manufacturing method of a solid-state imaging device including: forming a second conductivity type third impurity region in a semiconductor layer by forming a photoresist on a first conductivity type semiconductor layer and implanting a second conductivity type impurity ion in a first direction using the photoresist as a mask; forming a first conductivity type second impurity region in the semiconductor layer by implanting a first conductivity type impurity ion in a second direction using the photoresist as a mask; removing the photoresist; forming a gate insulating film on the semiconductor layer; forming a gate electrode on the gate insulating film; forming a first conductivity type first impurity region in the semiconductor layer so as to be outside the gate electrode and start from a first end portion of the gate electrode in plan view by implanting a first conductivity type impurity ion using the gate electrode as a mask, the first end portion of the gate electrode serving as a first mask end portion; and forming a second conductivity type fourth impurity region in the semiconductor layer that is located in the semiconductor layer and includes a portion that is under a second end portion of the gate electrode by implanting a second conductivity type impurity ion using the gate electrode as a mask, the second end portion of the gate electrode serving as a second mask end portion. The second impurity region is in contact with the first impurity region and is formed in the semiconductor layer so as to extend under the gate electrode from a first end portion side, the first impurity region. The second impurity region, the third impurity region, and the semiconductor layer are located in the stated order from the outside of the gate electrode on the first end portion side toward the second end portion of the gate electrode in plan view, and impurity concentration of the first impurity region, the second impurity region, and the semiconductor layer decreases in the stated order. The first direction is a direction inclined relative to a vertical direction to a surface of the semiconductor layer, and the second direction is a direction closer to the vertical direction than the first direction is.

According to the above aspect of the invention, because the third impurity region and the second impurity region that extend under the gate electrode from the first end portion side can be formed in a self-aligned manner, the third impurity region that is in contact with the gate insulating film can be formed without being influenced by a degree of alignment accuracy or variation in dimensions.

An aspect of the invention is a manufacturing method of a solid-state imaging device including: forming a second conductivity type third impurity region in a first conductivity type semiconductor layer; forming a gate insulating film on the semiconductor layer; forming a gate electrode on the gate insulating film; forming a first conductivity type second impurity region in the semiconductor layer by implanting a first conductivity type impurity ion in a first direction using the gate electrode as a mask, a first end portion of the gate electrode serving as a first mask end portion; forming a first conductivity type first impurity region that is located in the semiconductor layer so as to be outside the gate electrode and start from a first end portion of the gate electrode in plan view by implanting a first conductivity type impurity ion in a second direction, the first end portion of the gate electrode serving as the first mask end portion; and forming a second conductivity type fourth impurity region in the semiconductor layer that is located in the semiconductor layer and includes a portion that is under a second end portion of the gate electrode by implanting a second conductivity type impurity ion using the gate electrode as a mask, a second end portion of the gate electrode serving as a second mask end portion. The second impurity region is in contact with the first impurity region and is formed in the semiconductor layer so as to extend under the gate electrode from the first end portion side. The first impurity region, the second impurity region, the third impurity region, and the semiconductor layer are located in the stated order from the outside of the gate electrode on the first end portion side toward the second end portion of the gate electrode in plan view, and impurity concentration of the first impurity region, the second impurity region, and the semiconductor layer decreases in the stated order. The first direction is a direction inclined relative to a vertical direction to a surface of the semiconductor layer, and the second direction is a direction closer to the vertical direction than the first direction is.

According to the above aspect of the invention, because the second impurity region that extends under the gate electrode from the first end portion side and the first impurity region can be formed in a self-aligned manner, the second impurity region that extends under the gate electrode from the first end portion side can be formed without being influenced by a degree of alignment accuracy or variation in dimensions.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. However, the invention is not limited to the following description, and it can be easily understood by a person skilled in the art that various changes may be made to the form and the details of the invention without departing from the spirit and scope of the invention. Therefore, the invention is not to be construed as being limited to the following description of the embodiments.

Embodiment 1

Figure 1A:
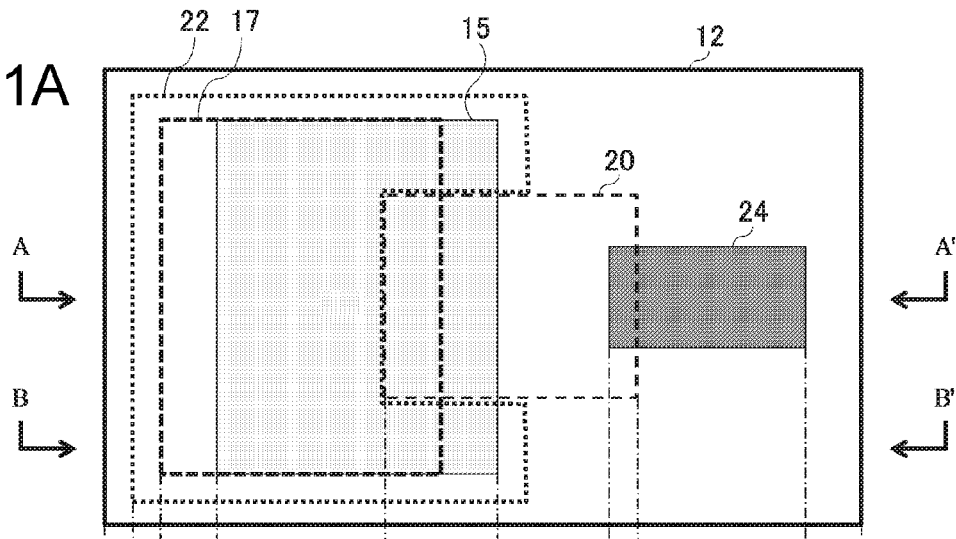
FIG. 1A is a plan view illustrating a solid-state imaging device according to an aspect of the invention.
Figure 1B:
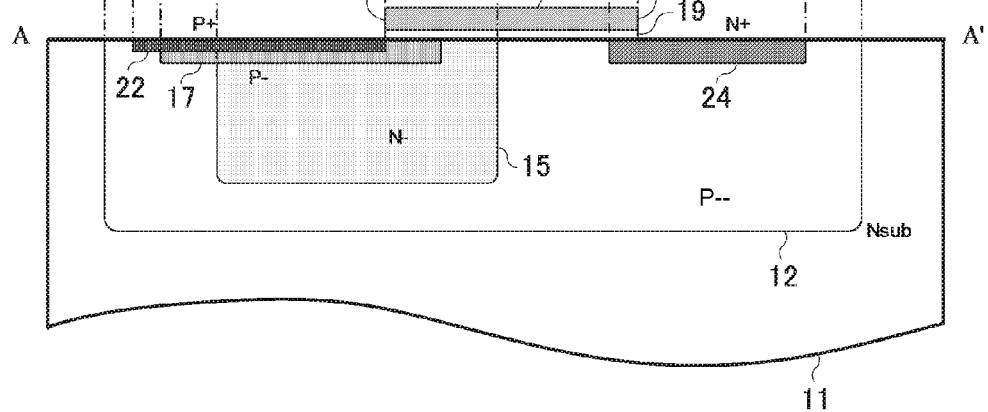
FIG. 1B is a cross-sectional view taken along line A-A' in FIG. 1A.
Figure 1C:
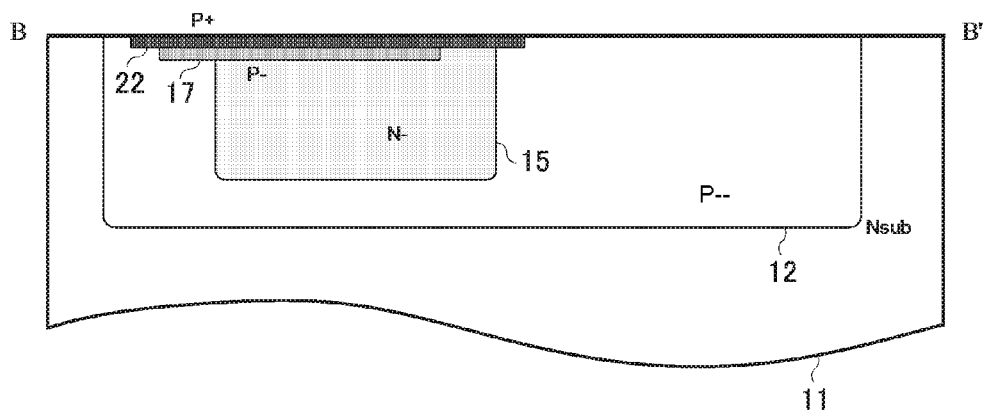
FIG. 1C is a cross-sectional view taken along line B-B' in FIG. 1A.

FIG. 1A is a plan view illustrating a solid-state imaging device according to an aspect of the invention, FIG. 1B is a cross-sectional view taken along line A-A' in FIG. 1A, and FIG. 1C is a cross-sectional view taken along line B-B' in FIG. 1A. FIGS. 2A to 4C are cross-sectional views for describing a manufacturing method of the solid-state imaging device shown in FIG. 1B. This solid-state imaging device is a device that is driven at a low voltage.

First, the manufacturing method of the solid-state imaging device will be described.

Figure 2A:
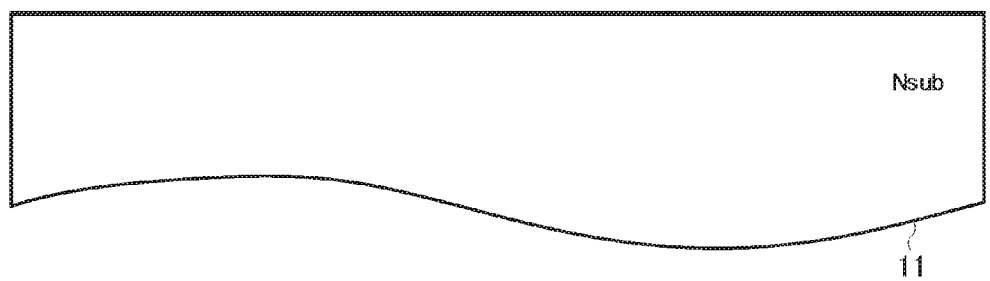
FIGS. 2A to 2C are cross-sectional views for describing a manufacturing method of the solid-state imaging device shown in FIG. 1B.

An N-type silicon substrate 11 is prepared, as shown in FIG. 2A. The impurity concentration in the N-type silicon substrate 11 is in the order of $1\times10^{14}$ atoms/cm$^3$, for example. Next, an element isolation region (LOCOS, for example), which is not shown, is formed in the N-type silicon substrate 11. A thermal oxide film (not shown) serving as a transmissive film when ion implantation is performed is formed on a surface of the N-type silicon substrate 11.

Figure 2B:
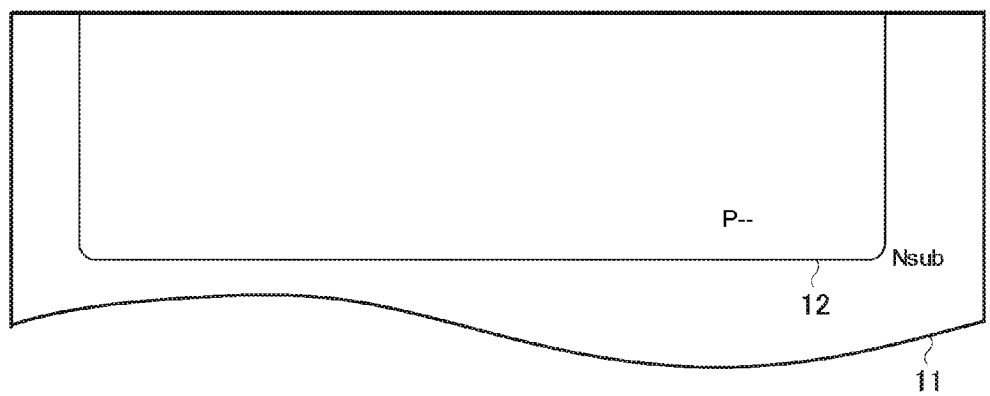

Next, P-type impurity ions such as boron are implanted into the N-type silicon substrate 11, and the impurity ions are caused to thermally diffuse by performing thermal processing, as shown in FIG. 2B. In this way, a P-well (P$^{--}$) 12 is formed in the N-type silicon substrate 11. Note that the P-well 12 may be formed by implanting P-type impurity ions at high energy. The impurity concentration of the P-well 12 is about $1\times10^{15}$ atoms/cm$^3$, for example.

Figure 2C:
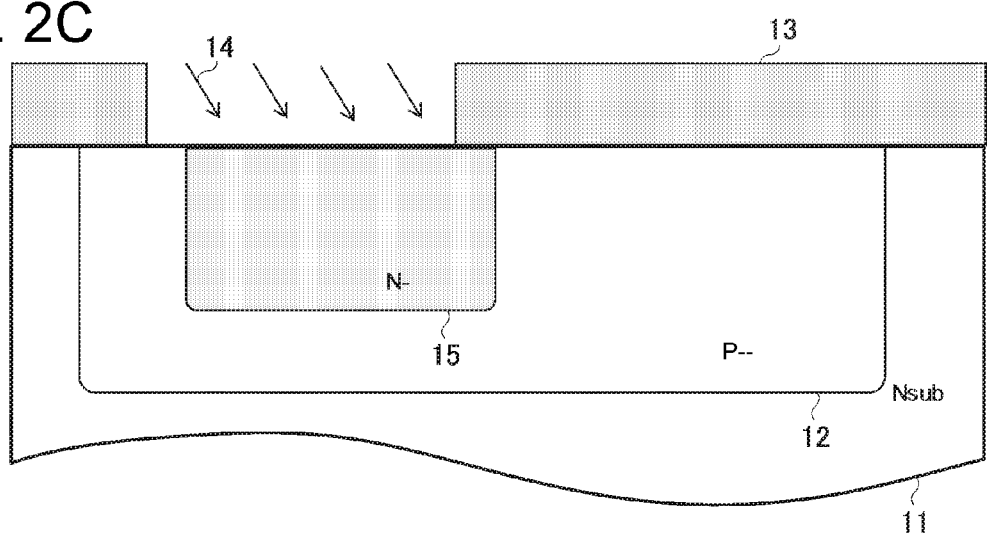

Thereafter, a photoresist 13 is formed on the P-well (also referred to as a first conductivity type semiconductor layer) 12 by using photolithography technology, as shown in FIG. 2C. An opening is formed in the photoresist 13 in a region where a photodiode will be formed. Next, by implanting N-type (second conductivity type) impurity ions in a first direction 14 using the photoresist 13 as a mask, an N$^-$-type impurity region (also referred to as a second conductivity type third impurity region) 15 is formed in the P-well 12. The first direction 14 is a direction that is inclined relative to a vertical direction to a surface of the P-well 12 or the surface of the N-type silicon substrate 11. Specifically, implanting in the first direction 14 is to implant in an oblique direction from the photodiode side toward a region where a gate electrode will be formed later.

The above ion implantation may be performed by, for example, implanting phosphorus in multi-steps at an energy from about 1.2 MeV to 150 KeV (two or more times with changing energy) so as to form an impurity profile in which the concentration increases from a deep side to a shallow side in the N$^-$-type impurity region 15. The ion implantation may be performed so as to make the concentration to be from about $1\times10^{15}$ atoms/cm$^3$ to $1\times10^{16}$ atoms/cm$^3$ such that a depletion layer to be formed in the vicinity of the interface between a surrounding P-type diffusion layer and the N$^-$-type impurity region 15 extends over the N$^-$-type impurity region 15 of the photodiode.

Note that, in the present embodiment, although the P-well 12 is formed in the N-type silicon substrate 11 and the N$^-$-type impurity region 15 is formed in the P-well 12, a P-type silicon layer may be formed on the N-type silicon substrate 11 by using an epitaxial growth method, and the N$^-$-type impurity region 15 may be formed in the P-type silicon layer.

Figure 3A:
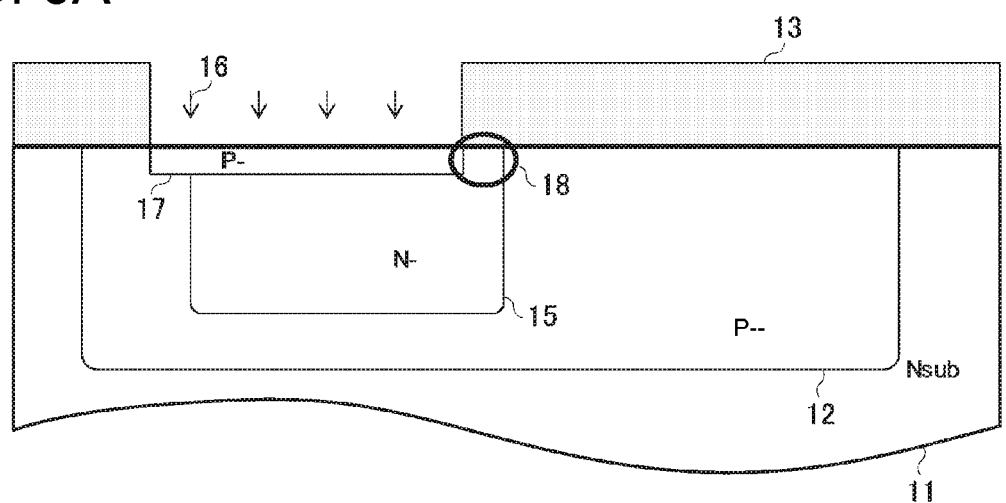
FIGS. 3A to 3B are cross-sectional views for describing a manufacturing method of the solid-state imaging device shown in FIG. 1B.

Next, P-type (first conductivity type) impurity ions are implanted in a second direction 16 on a surface of the P-well 12 and the N$^-$-type impurity region 15 using the photoresist 13 as a mask, as shown in FIG. 3A. Thus, a P$^-$-type impurity region (also referred to as a first conductivity type second impurity region) 17 is formed in the P-well 12. At this time, impurity ions are implanted in the second direction 16, which is a direction close to the vertical direction to the surface of the P-well 12 or the surface of the N-type silicon substrate 11, such that the N$^-$-type impurity region 15 remains in a region 18. The second direction 16 is a direction closer to the vertical direction than the first direction 14 is.

Figure 3B:
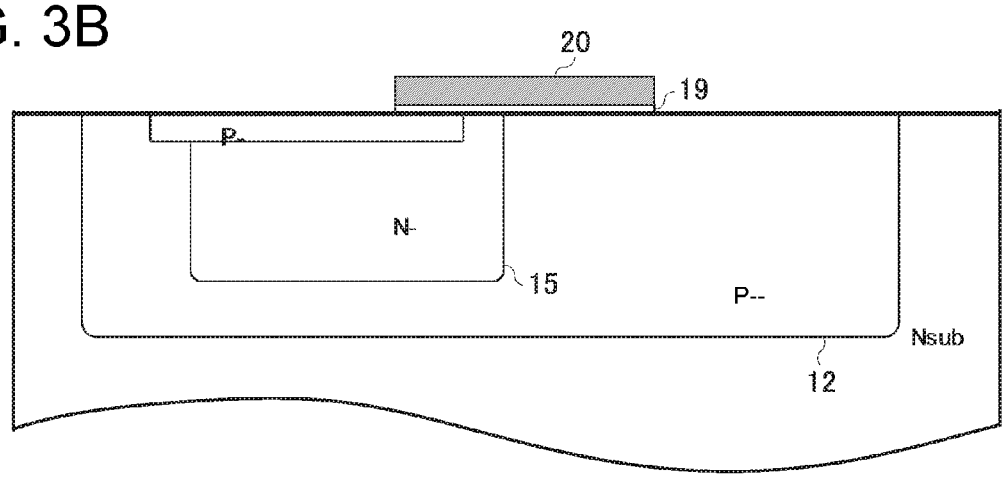

Thereafter, after the photoresist 13 is removed and the transmissive film is removed, a gate insulating film 19 is formed on the P-well 12 and a transfer gate electrode 20 is formed on the gate insulating film 19, as shown in FIG. 3B.

Figure 4A:
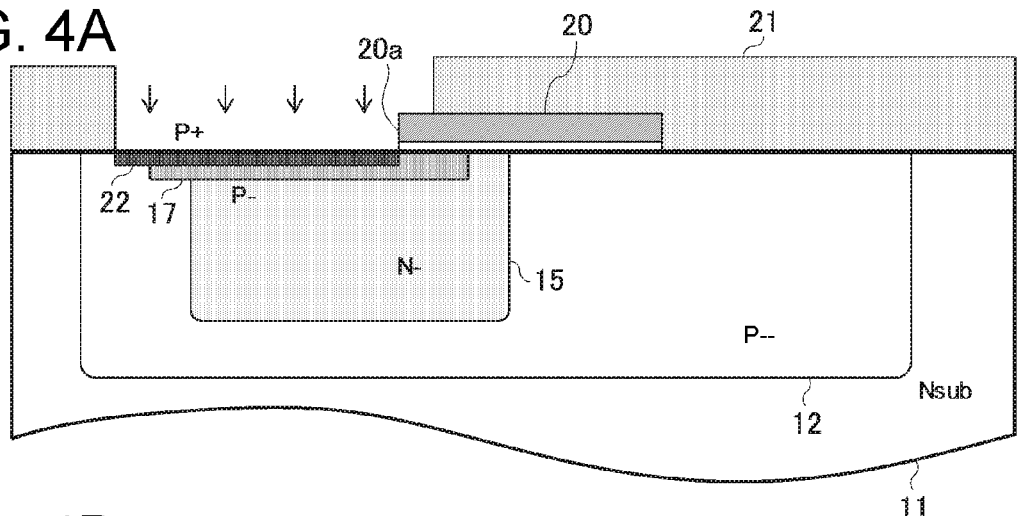
FIGS. 4A to 4C are cross-sectional views for describing a manufacturing method of the solid-state imaging device shown in FIG. 1B.

Next, a photoresist 21 is formed on the transfer gate electrode 20 and the N-type silicon substrate 11 by using photolithography technology, as shown in FIG. 4A. Next, by implanting P-type impurity ions on a surface of the photodiode using the photoresist 21 and the transfer gate electrode 20 as a mask, a first end portion 20a of the transfer gate electrode 20 serving as a first mask end portion, a P$^+$-type pinning layer (also referred to as a first conductivity type first impurity region) 22 is formed in the P$^-$-type impurity region 17 and the P-well 12 in a portion that is outside the transfer gate electrode 20 and starts from the first end portion 20a thereof in plan view. At this time, a portion of the P$^-$-type impurity region 17 may be located under the pinning layer 22.

Figure 4B:
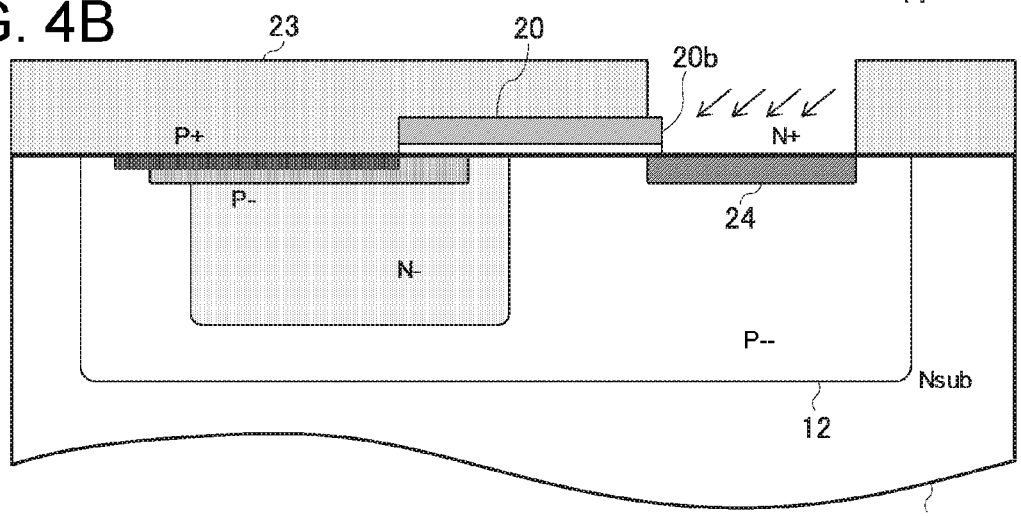

Thereafter, the photoresist 21 is removed and a photoresist 23 is formed on the transfer gate electrode 20 and the N-type silicon substrate 11 by using photolithography technology, as shown in FIG. 4B. Next, by implanting N-type impurity ions using the photoresist 23 and the transfer gate electrode 20 as a mask, a second end portion 20b of the transfer gate electrode 20 serving as a second mask end portion, an N$^+$-type impurity region (also referred to as a second conductivity type fourth impurity region) 24 is formed in the P-well 12 in a portion including a portion under the second end portion 20b of the transfer gate electrode 20. The N$^+$-type impurity region 24 becomes a floating diffusion region in which read-out charges are temporarily stored. It is desirable that impurity ions are implanted to the N$^+$-type impurity region 24 in an oblique direction toward the transfer gate electrode 20.

Note that although, in the present embodiment, the floating diffusion region (N⁺ region) is formed after the transfer gate electrode 20 is formed, the floating diffusion region may be formed before the transfer gate electrode 20 is formed. In this case, because the floating diffusion region cannot be formed in a self-aligned manner with respect to the transfer gate electrode 20, an opening is preferably formed in the photoresist such that the N⁺ region overlaps with the transfer gate electrode 20.

Figure 4C:
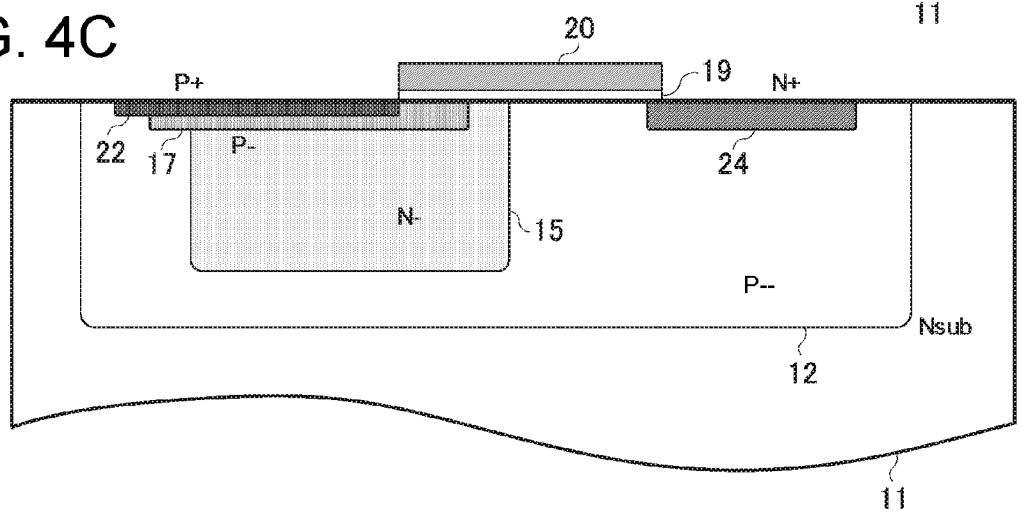

Next, the photoresist 23 is removed, as shown in FIG. 4C. In this way, the solid-state imaging device shown in FIG. 1B is manufactured. Thereafter, an interlayer insulating film (not shown) is formed on an entire surface of the N-type silicon substrate 11 including the transfer gate electrode 20, and Al alloy interconnects and the like, which are not shown, are formed on the interlayer insulating film.

The P⁺-type pinning layer 22 of the solid-state imaging device shown in FIG. 1 is formed in the P-well 12 so as to be outside the transfer gate electrode 20 and start from the first end portion 20a thereof in plan view. The P⁻-type impurity region 17 is located in the P-well 12 so as to extend under the transfer gate electrode 20 from the first end portion 20a side thereof, and is in contact with the P⁺-type pinning layer 22. The P⁻-type impurity region 17 is also formed under the P⁺-type pinning layer 22. The N⁻-type impurity region 15 is located in the P-well 12 so as to extend under the P⁺-type pinning layer 22 and the P⁻-type impurity region 17 and be in contact with the P⁻-type impurity region 17 and the gate insulating film 19. The N⁺-type impurity region 24 is formed in the P-well 12 and includes a portion that is under the second end portion 20b of the transfer gate electrode 20.

Also, the P⁻-type impurity region 17 of the solid-state imaging device shown in FIG. 1 is in contact with the P⁺-type pinning layer 22 and a portion thereof is formed in the P-well 12 and the N⁻-type impurity region 15 so as to extend under the transfer gate electrode 20 from the first end portion 20a side. The P⁺-type pinning layer 22, the P⁻-type impurity region 17, the N⁻-type impurity region 15, and the P-well 12 are located in the stated order from the outside of the transfer gate electrode 20 on the first end portion 20a side toward the second end portion 20b of the transfer gate electrode 20 (refer to FIG. 1B) in plan view. Also, the impurity concentration in the P⁺-type pinning layer 22, the P⁻-type impurity region 17, and the P-well 12 decreases in the stated order.

The photodiode (light receiving element) is formed by a P⁺ layer, a P⁻ layer, an N⁻ layer, and a P⁻⁻ layer in the stated order from the surface toward the deep side of the Si substrate. The N⁺-type impurity region (floating diffusion) 24 that is to receive transferred charges is arranged separated from the diffusion layer that constitutes the light receiving element. The transfer gate electrode 20 is arranged on a surface of the substrate between the photodiode and the floating diffusion via an insulating oxide film.

Figure 5A:
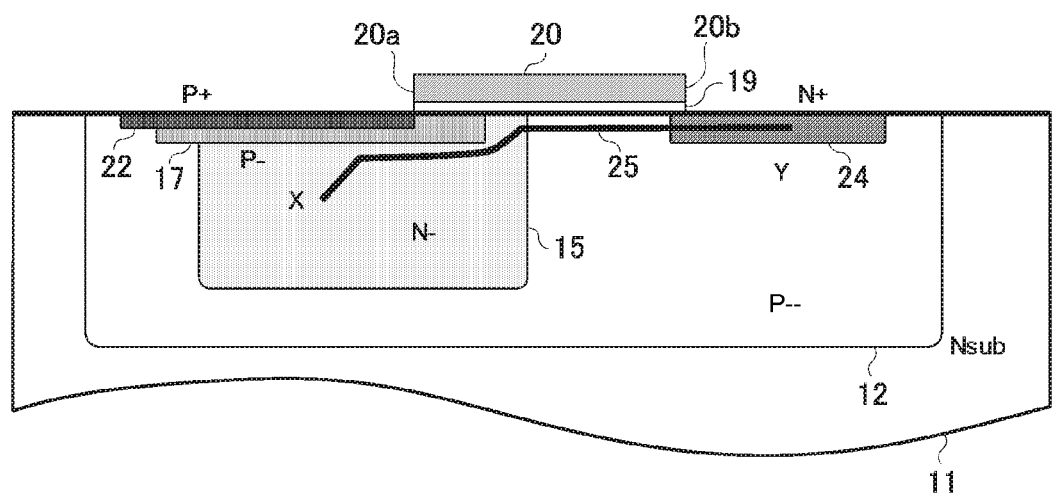
FIG. 5A is a cross-sectional view of the solid-state imaging device shown in FIG. 1B.
Figure 5B:
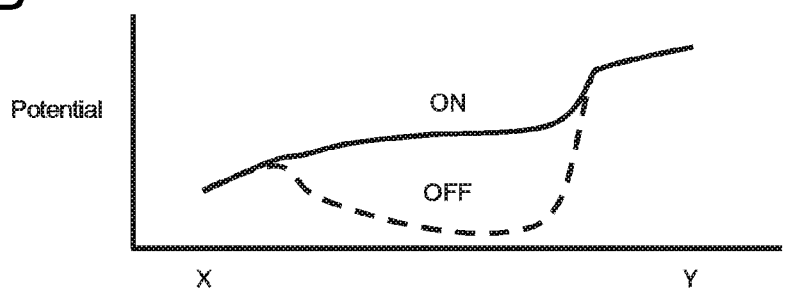
FIG. 5B is a potential diagram when charges are transferred from X to Y in FIG. 5A in the case where a transfer gate is on and off.

FIG. 5A is a cross-sectional view of the solid-state imaging device shown in FIG. 1B, and FIG. 5B is a potential diagram when charges are transferred from X to Y in FIG. 5A in the case where a transfer gate is on and off.

According to the present embodiment, a portion of the N⁻-type impurity region 15 that extends from the photodiode is in contact with the gate insulating film 19 under the transfer gate electrode 20, as shown in FIG. 5A. Therefore, charge transfer failure due to a transfer barrier can be prevented from occurring when a charge transfer 25 is performed (refer to FIG. 5B). Accordingly, a transfer channel can be stably formed at a low voltage.

Also, due to the diffusion layer of the P⁻-type impurity region 17 that is in contact with the gate insulating film 19, a potential well that might be formed in the transfer channel can be reliably prevented from forming. As a result, a charge transfer failure due to the potential well can be prevented from occurring (refer to FIG. 5B).

Also, in the present embodiment, the N⁻-type impurity region 15 that extends from the photodiode and the P⁻-type impurity region 17 whose portion is surrounded by the N⁻-type impurity region 15 can be formed in a self-aligned manner, as shown in FIG. 2C and FIG. 3A. Accordingly, the transfer channel formed in the region 18 of the N⁻-type impurity region 15 shown in FIG. 3A can be formed without being influenced by a degree of alignment accuracy or variation in dimensions. Therefore, formation of the potential well and the potential barrier can be suppressed when a charge transfer is performed.

Note that although, in the present embodiment, a solid-state imaging device in which charges to be transferred are electrons is manufactured, a solid-state imaging device in which charges to be transferred are holes can also be manufactured by constituent members each having a polarity opposite to that of the corresponding constituent members and reversing polarities of the applied voltages.

Embodiment 2

FIGS. 6A to 8C are cross-sectional views for describing a manufacturing method of a solid-state imaging device according to an aspect of the invention. Portions that are similar to those in FIGS. 1A to 4C are given the same reference signs. The solid-state imaging device has the same structure as the solid-state imaging device shown in FIG. 1.

First, a manufacturing method of the solid-state imaging device will be described.

Figure 6A:
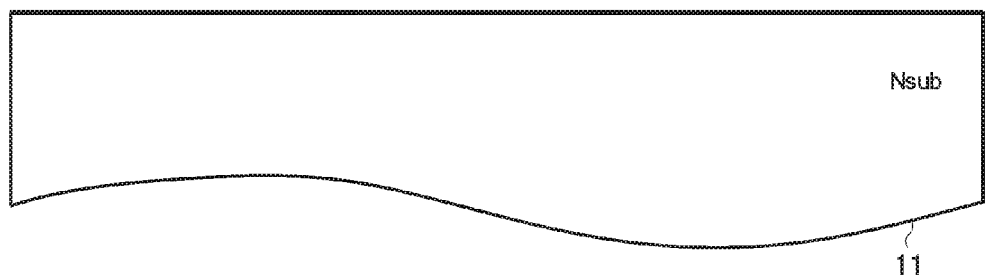
FIGS. 6A to 6C are cross-sectional views for describing a manufacturing method of a solid-state imaging device according to an aspect of the invention.
Figure 6B:
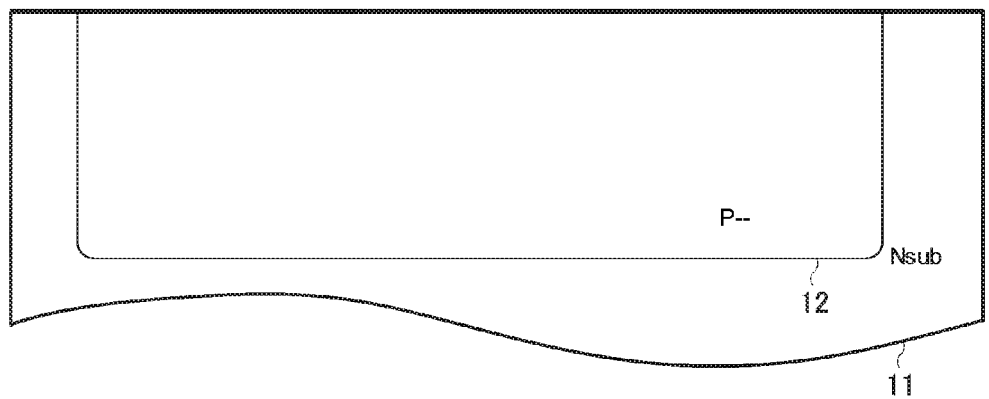

Steps from preparation of an N-type silicon substrate 11 until formation of a P-well (P⁻⁻) 12 in the N-type silicon substrate 11 are similar to those in Embodiment 1, as shown in FIGS. 6A and 6B.

Figure 6C:
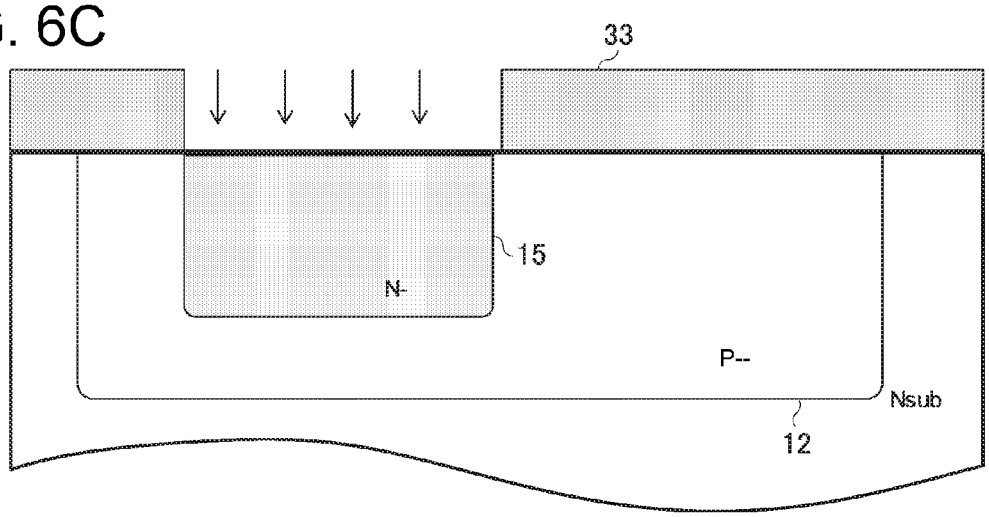

Thereafter, a photoresist 33 is formed on the P-well 12 by using photolithography technology, as shown in FIG. 6C. An opening is formed in the photoresist 33 in a region where a photodiode will be formed. Next, by implanting N-type (second conductivity type) impurity ions using the photoresist 33 as a mask, an N⁻-type impurity region (also referred to as a second conductivity type third impurity region) 15 is formed in the P-well 12.

Figure 7A:
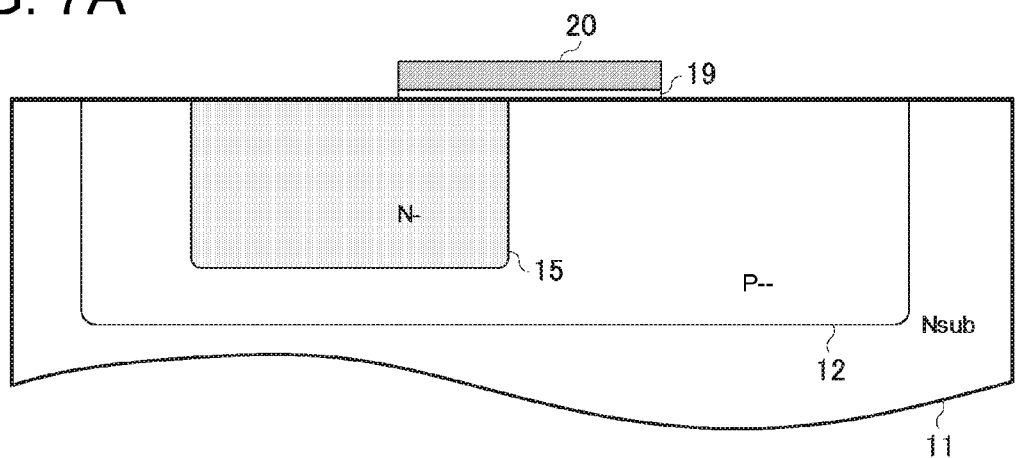
FIGS. 7A and 7B are cross-sectional views for describing the manufacturing method of the solid-state imaging device according to the aspect of the invention.

Thereafter, after the photoresist 33 is removed and the transmissive film is removed, a gate insulating film 19 is formed on the P-well 12 and a transfer gate electrode 20 is formed on the gate insulating film 19, as shown in FIG. 7A.

Figure 7B:
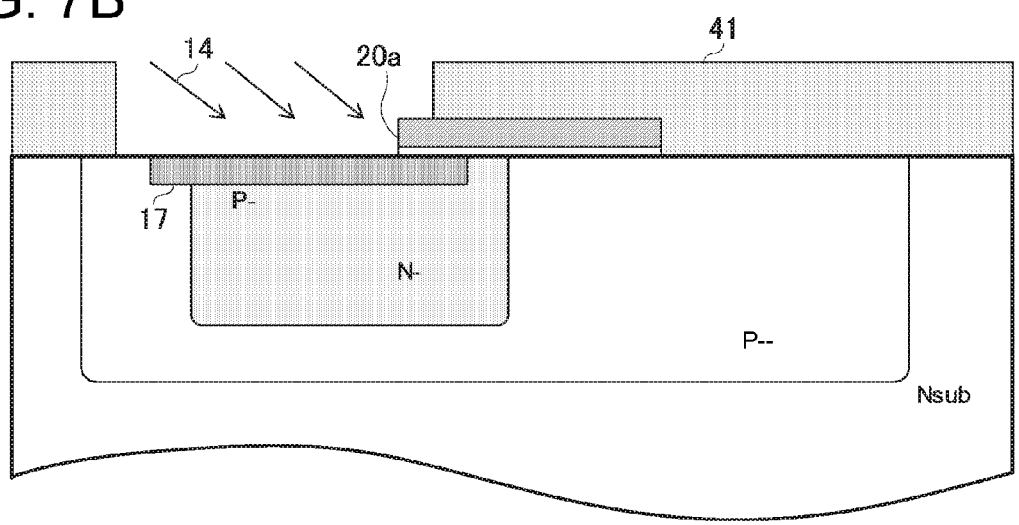

Next, a photoresist 41 is formed on the transfer gate electrode 20 and the N-type silicon substrate 11 by using photolithography technology, as shown in FIG. 7B. Next, P-type impurity ions are implanted on a surface of the photodiode in a first direction 14 using the photoresist 41 and the transfer gate electrode 20 as a mask, a first end portion 20a of the transfer gate electrode 20 serving as a first mask end portion. Accordingly, a P⁻-type impurity region (also referred to as a first conductivity type second impurity region) 17 is formed in the P-well 12. The first direction 14 is a direction that is inclined relative to a vertical direction to a surface of the P-well 12 or the surface of the N-type silicon substrate 11. Specifically, implanting in the first direction 14 is to implant in an oblique direction from the photodiode side toward the transfer gate electrode 20.

Figure 8A:
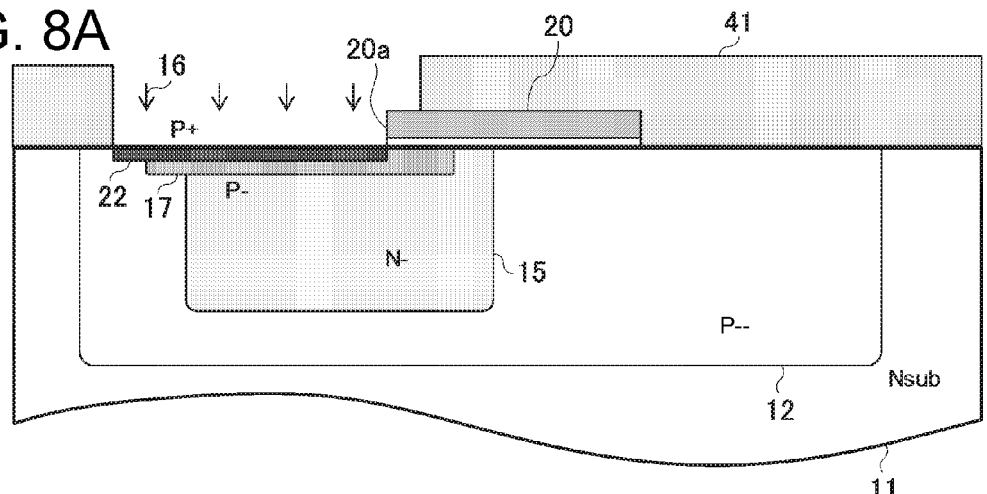
FIGS. 8A to 8C are cross-sectional views for describing the manufacturing method of the solid-state imaging device according to the aspect of the invention.

Next, as shown in FIG. 8A, by implanting P-type impurity ions on the surface of the photodiode in a second direction 16 using the photoresist 41 and the transfer gate electrode 20 as a mask, the first end portion 20a of the transfer gate electrode 20 serving as the first mask end portion, a P+-type pinning layer (also referred to as a first conductivity type first impurity region) 22 is formed in the P−-type impurity region 17 and the P-well 12 in a portion that is not covered by the transfer gate electrode 20 and starts from the first end portion 20a thereof. At this time, a portion of the P−-type impurity region 17 may be located under the pinning layer 22. The second direction 16 is a direction that is closer to the vertical direction than the first direction 14 is, which will be described later.

The ion implantation described above may be performed by, for example, implanting boron at a dose from about $5 \times 10^{12}$ atoms/cm² to $5 \times 10^{13}$ atoms/cm². The ion implantation may be performed so as to make the concentration in the pinning layer 22 to be from about $1 \times 10^{17}$ atoms/cm³ to $1 \times 10^{18}$ atoms/cm³.

Figure 8B:
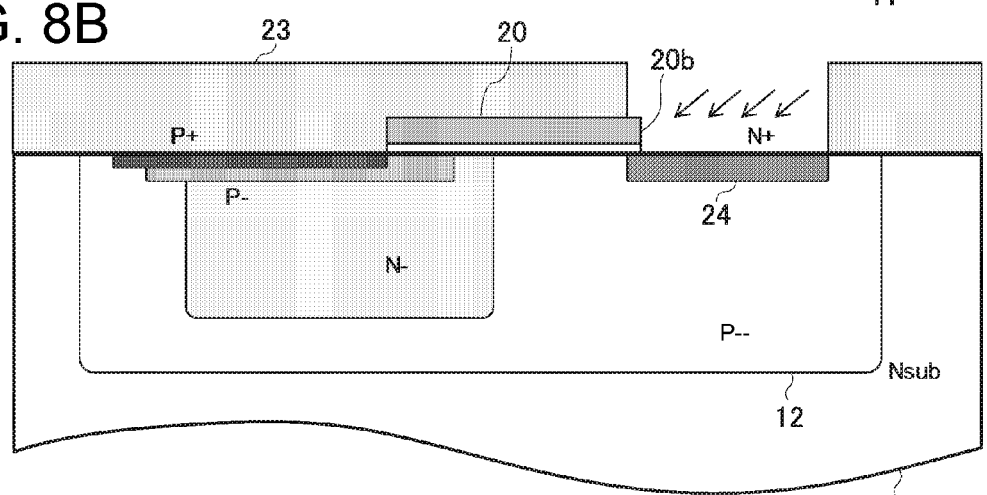

Thereafter, as shown in FIG. 8B, the photoresist 41 is removed, and a photoresist 23 is formed on the transfer gate electrode 20 and the N-type silicon substrate 11 by using photolithography technology. Next, in a manner similar to that in Embodiment 1, by implanting N-type impurity ions using the photoresist 23 and the transfer gate electrode 20 as a mask, a second end portion 20b of the transfer gate electrode 20 serving as a second mask end portion, an N+-type impurity region (also referred to as a second conductivity type fourth impurity region) 24 is formed, in the P-well 12, that includes a portion under the second end portion 20b of the transfer gate electrode 20.

Figure 8C:
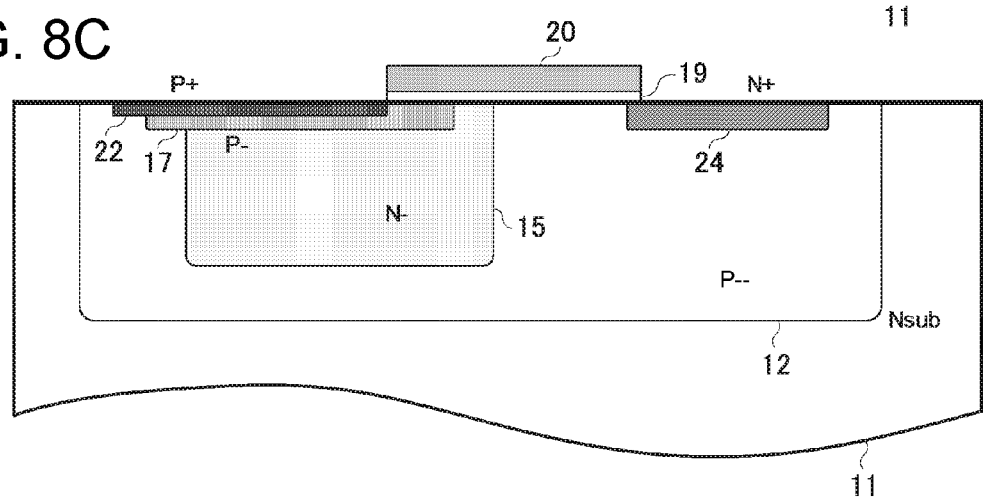

Next, the photoresist 23 is removed, as shown in FIG. 8C. In this way the solid-state imaging device shown in FIG. 1B is manufactured.

In the solid-state imaging device of the present embodiment also, similar effects as those in Embodiment 1 can be obtained.

Also, in the present embodiment, the P−-type impurity region 17 that extends under the transfer gate electrode 20 from the first end portion 20a side and the P+-type pinning layer 22 whose portion is surrounded by the P−-type impurity region 17 can be formed in a self-aligned manner, as shown in FIGS. 7B and 8A. Accordingly, the P−-type impurity region 17, shown in FIG. 8A, that extends under the transfer gate electrode 20 from the first end portion 20a side thereof can be formed without being influenced by a degree of alignment accuracy or variation in dimensions.

Embodiment 3

Figure 9A:
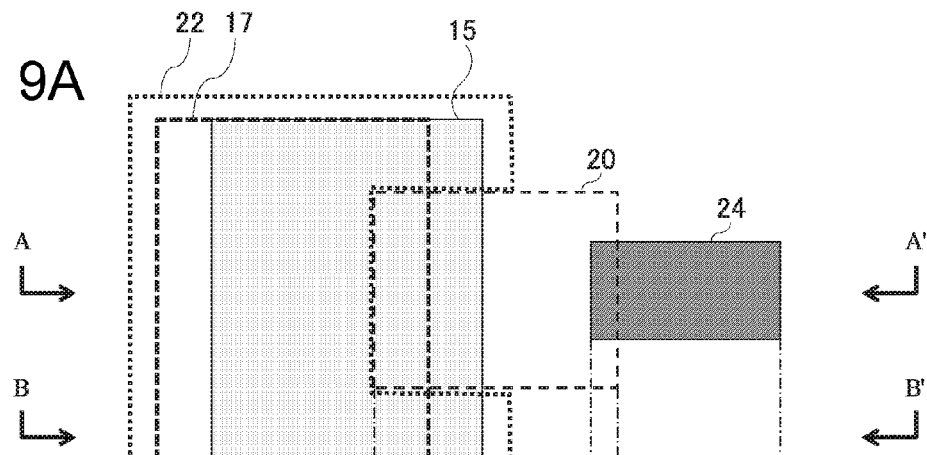
FIG. 9A is a plan view illustrating a solid-state imaging device according to an aspect of the invention.
Figure 9B:
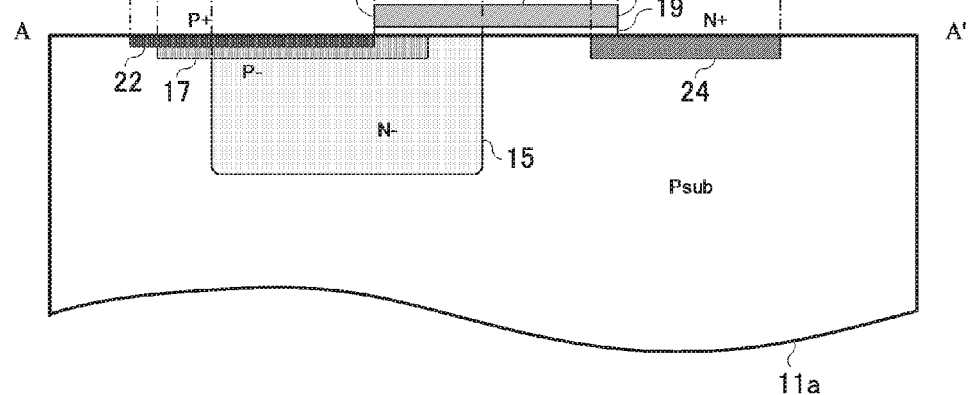
FIG. 9B is a cross-sectional view taken along line A-A' in FIG. 9A.
Figure 9C:
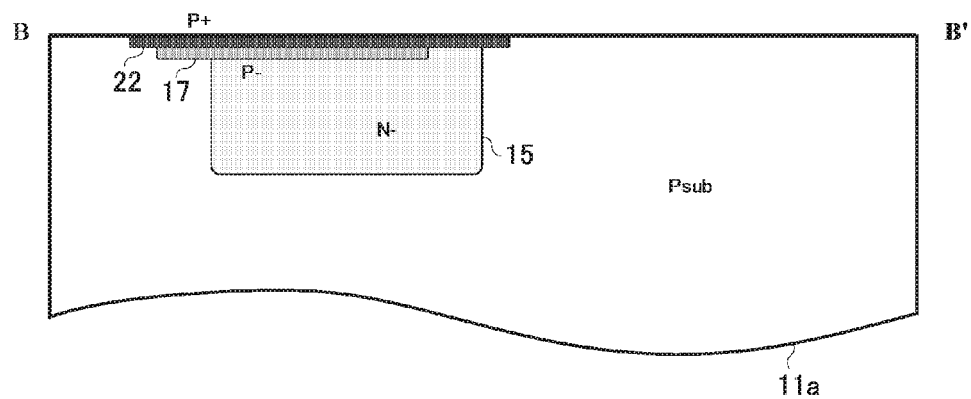
FIG. 9C is a cross-sectional view taken along line B-B' in FIG. 9A.

FIG. 9A is a plan view illustrating a solid-state imaging device according to an aspect of the invention, FIG. 9B is a cross-sectional view taken along line A-A' in FIG. 9A, and FIG. 9C is a cross-sectional view taken along line B-B' in FIG. 9A. Portions that are similar to those in FIGS. 1A to 1C are given the same reference signs. Only portions that are different from those in FIGS. 1A to 1C will be described.

In the solid-state imaging device shown in FIGS. 1A to 1C, the P-well 12 is formed in the N-type silicon substrate 11, and the N−-type impurity region 15 is formed in the P-well 12. In contrast, in the solid-state imaging device shown in FIGS. 9A to 9C, an N−-type impurity region (also referred to as a second conductivity type third impurity region) 15 is formed in a P-type silicon substrate 11a.

In the present embodiment also, similar effects as those in Embodiment 1 can be obtained.

Embodiment 4

Figure 10A:
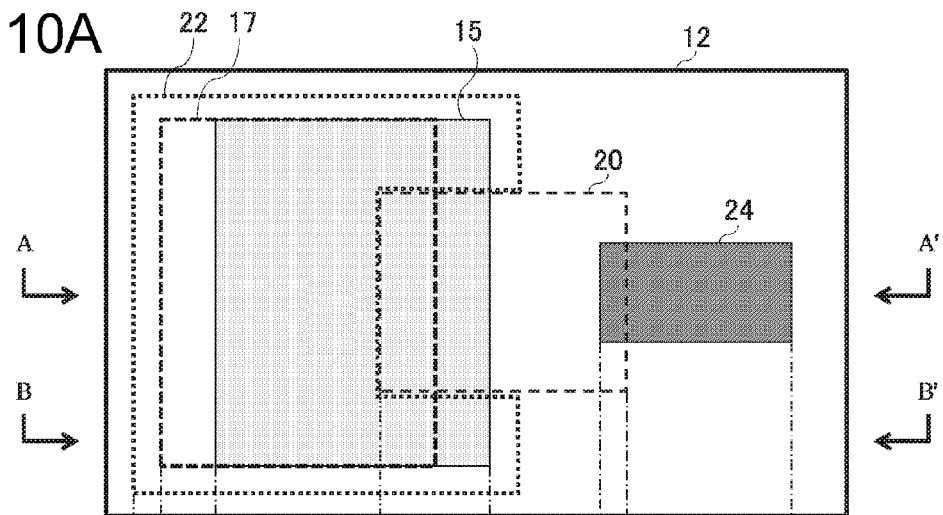
FIG. 10A is a plan view illustrating a solid-state imaging device according to an aspect of the invention.
Figure 10B:
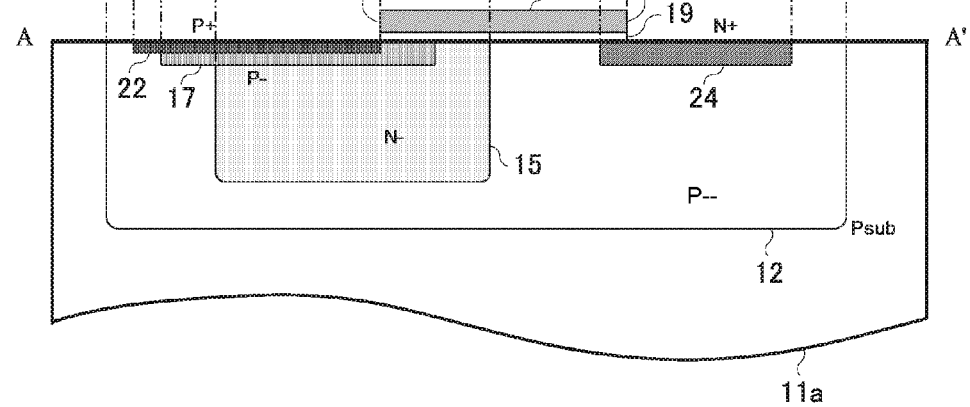
FIG. 10B is a cross-sectional view taken along line A-A' in FIG. 10A.
Figure 10C:
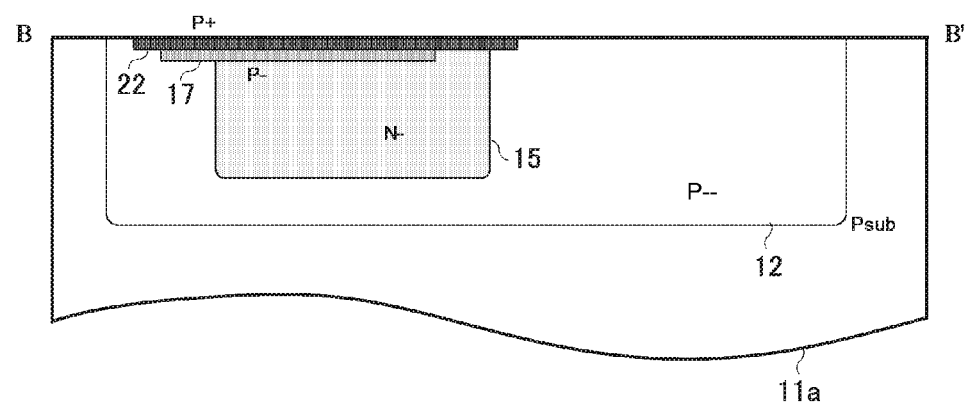
FIG. 10C is a cross-sectional view taken along line B-B' in FIG. 10A.

FIG. 10A is a plan view illustrating a solid-state imaging device according to an aspect of the invention, FIG. 10B is a cross-sectional view taken along line A-A' in FIG. 10A, and FIG. 10C is a cross-sectional view taken along line B-B' in FIG. 10A. In FIGS. 10A to 10C, portions that are similar to those in FIGS. 1A to 1C are given the same reference signs. Only portions that are different from those in FIGS. 1A to 1C will be described.

In the solid-state imaging device shown in FIGS. 1A to 1C, the P-well 12 is formed in the N-type silicon substrate 11, whereas a P-well 12 is formed in a P-type silicon substrate 11a in the solid-state imaging device shown in FIGS. 10A to 10C.

In the present embodiment also, similar effects as those in Embodiment 1 can be obtained.

Embodiment 5

Figure 11A:
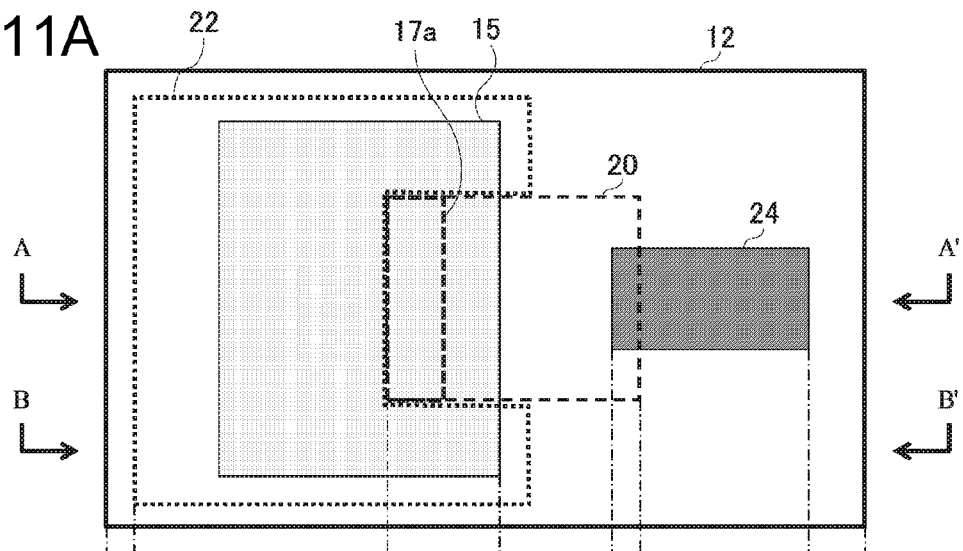
FIG. 11A is a plan view illustrating a solid-state imaging device according to an aspect of the invention.
Figure 11B:
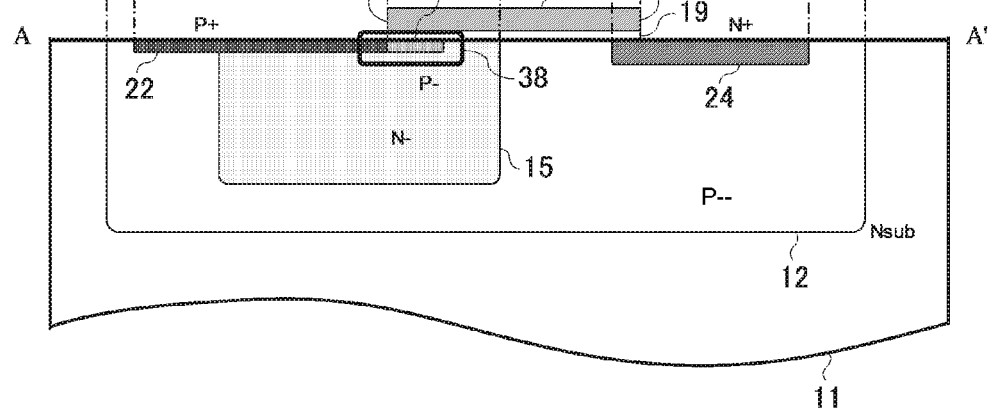
FIG. 11B is a cross-sectional view taken along line A-A' in FIG. 11A.
Figure 11C:
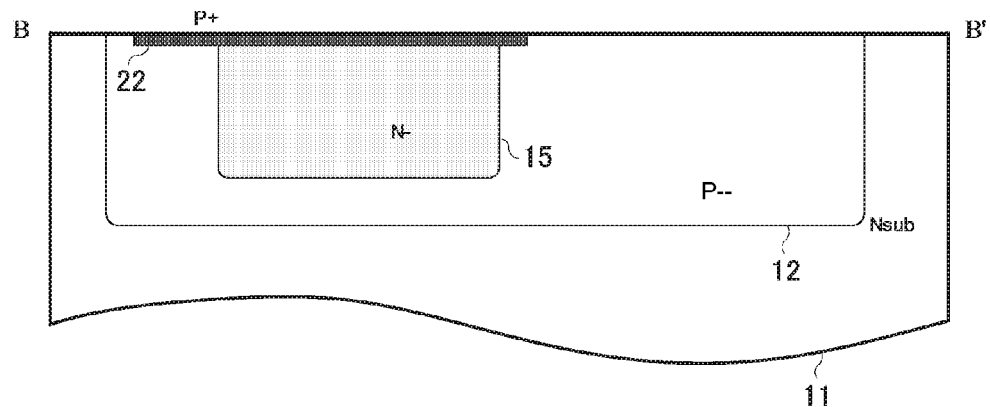
FIG. 11C is a cross-sectional view taken along line B-B' in FIG. 11A.
Figure 12A:
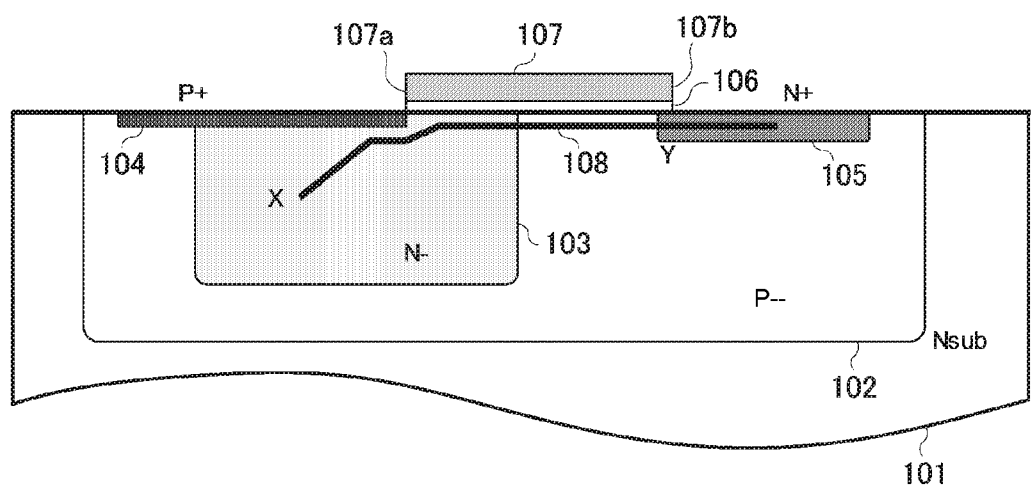
FIG. 12A is a cross-sectional view of a known solid-state imaging device.
Figure 12B:
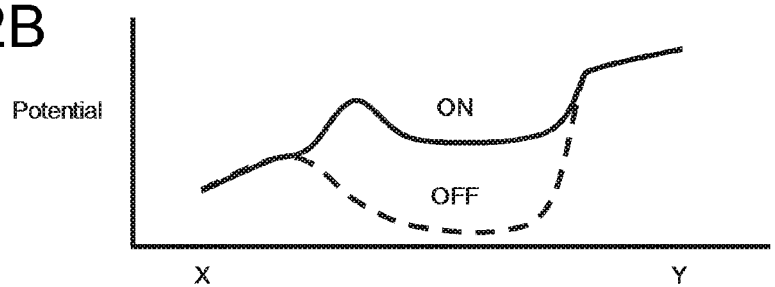
FIG. 12B is a potential diagram when charges are transferred from X to Y in FIG. 12A in the case where a transfer gate is on and off.
Figure 13A:
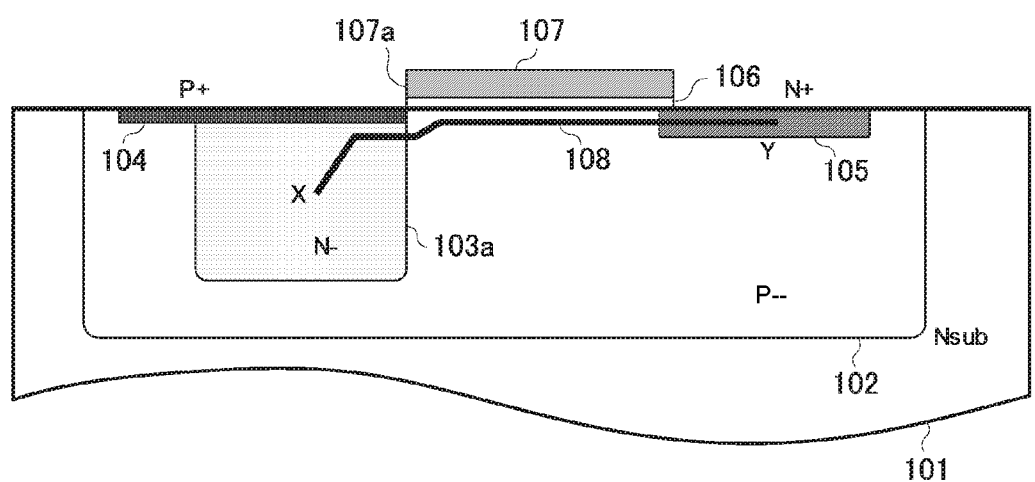
FIG. 13A is a cross-sectional view of another known solid-state imaging device.
Figure 13B:
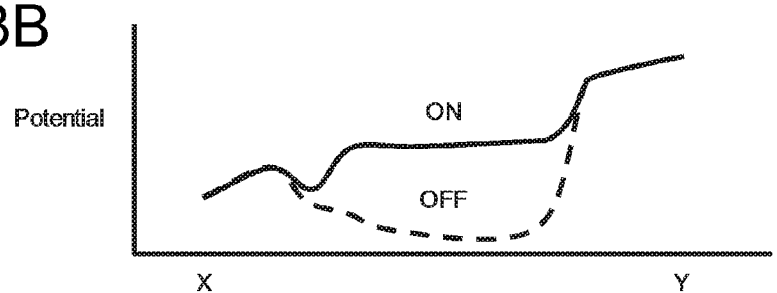
FIG. 13B is a potential diagram when charges are transferred from X to Y in FIG. 13A in the case where a transfer gate is on and off.

FIG. 11A is a plan view illustrating a solid-state imaging device according to an aspect of the invention, FIG. 11B is a cross-sectional view taken along line A-A' in FIG. 11A, and FIG. 11C is a cross-sectional view taken along line B-B' in FIG. 11A. In FIGS. 11A to 11C, portions that are similar to those in FIGS. 1A to 1C are given the same reference signs. Only portions that are different from those in FIGS. 1A to 1C will be described.

The P−-type impurity region 17 extends under the P+-type pinning layer 22 in the solid-state imaging device shown in FIGS. 1A to 1C, whereas a P−-type impurity region (also referred to as a first conductivity type second impurity region) 17a is formed only under a gate electrode 20 in the solid-state imaging device shown in FIGS. 11A to 11C, as shown in a region 38. In other words, the P-type impurity region 17a does not exist outside of the gate electrode 20 from the first end portion 20a thereof in plan view.

In the present embodiment also, similar effects as those in Embodiment 1 can be obtained.

Note that in the invention, forming a specific component B (hereinafter referred to as "B") (B is formed) on (or under) a specific component A (hereinafter referred to as "A") is not limited to cases of forming B (B being formed) directly on (or under) A. Cases of forming B (B being formed) on (or under) A via another component without impeding the effects of the invention may also be included therein.

Also, a direction designated by on (or under) for describing a configuration is not necessarily limited to one direction. For example, cases of forming B (B being formed) on (or under) A include cases of forming B (B being formed) under (or on) A, when a semiconductor device is used in a vertically inverted orientation.

Also, the above Embodiments 1 to 5 can be implemented by combining Embodiments 1 to 5 appropriately.

The entire disclosure of Japanese Patent Application No. 2015-055694, filed Mar. 19, 2015 is expressly incorporated by reference herein.

What is claimed is:

1. A solid-state imaging device comprising:
   a first conductivity type semiconductor layer;
   a gate insulating film located on the semiconductor layer;
   a gate electrode located on the gate insulating film;
   a first conductivity type first impurity region that is located in the semiconductor layer so as to be outside the gate electrode and start from a first end portion of the gate electrode in plan view;
   a first conductivity type second impurity region that is located in the semiconductor layer so as to extend under the gate electrode from a first end portion side and be in contact with the first impurity region;
   a second conductivity type third impurity region that is located in the semiconductor layer so as to extend under the first impurity region and the second impurity region and be in contact with the second impurity region and the gate insulating film, and the second conductivity type third impurity region is in direct contact with the gate insulating film; and a second conductivity type fourth impurity region that is located in the semiconductor layer and includes a portion that is under a second end portion of the gate electrode, wherein the first impurity region, the second impurity region, the third impurity region, and the semiconductor layer are located in the stated order from the outside of the gate electrode on the first end portion side toward the second end portion of the gate electrode in plan view, and impurity concentration in the first impurity region, the second impurity region, and the semiconductor layer decreases in the stated order.

2. The solid-state imaging device according to claim 1, wherein the second impurity region includes a portion that is located under the first impurity region.

3. The solid-state imaging device according to claim 1, wherein the second impurity region does not exist outside of the gate electrode from the first end portion in plan view.

4. The solid-state imaging device according to claim 1, wherein the semiconductor layer is a first conductivity type well, and the first conductivity type well is located in a semiconductor substrate.

5. The solid-state imaging device according to claim 1, wherein the semiconductor layer is a first conductivity type semiconductor substrate.

6. A manufacturing method of a solid-state imaging device comprising:

forming a second conductivity type third impurity region in a semiconductor layer by forming a photoresist on a first conductivity type semiconductor layer and implanting a second conductivity type impurity ion in a first direction using the photoresist as a mask;

forming a first conductivity type second impurity region in the semiconductor layer by implanting a first conductivity type impurity ion in a second direction using the photoresist as a mask;

removing the photoresist;

forming a gate insulating film on the semiconductor layer;

forming a gate electrode on the gate insulating film;

forming a first conductivity type first impurity region in the semiconductor layer so as to be outside the gate electrode and start from a first end portion of the gate electrode in plan view by implanting a first conductivity type impurity ion using the gate electrode as a mask, the first end portion of the gate electrode serving as a first mask end portion; and forming a second conductivity type fourth impurity region in the semiconductor layer that is located in the semiconductor layer and includes a portion that is under a second end portion of the gate electrode by implanting a second conductivity type impurity ion using the gate electrode as a mask, the second end portion of the gate electrode serving as a second mask end portion, wherein the second impurity region is in contact with the first impurity region and is formed in the semiconductor layer so as to extend under the gate electrode from a first end portion side, the first impurity region, the second impurity region, the third impurity region, and the semiconductor layer are located in the stated order from the outside of the gate electrode on the first end portion side toward the second end portion of the gate electrode in plan view, and impurity concentration of the first impurity region, the second impurity region, and the semiconductor layer decreases in the stated order, the first direction is a direction inclined relative to a vertical direction to a surface of the semiconductor layer, and the second direction is a direction closer to the vertical direction than the first direction is.

7. A manufacturing method of a solid-state imaging device comprising:

forming a second conductivity type third impurity region in a first conductivity type semiconductor layer;

forming a gate insulating film on the semiconductor layer;

forming a gate electrode on the gate insulating film;

forming a first conductivity type second impurity region in the semiconductor layer by implanting a first conductivity type impurity ion in a first direction using the gate electrode as a mask, a first end portion of the gate electrode serving as a first mask end portion;

forming a first conductivity type first impurity region that is located in the semiconductor layer so as to be outside the gate electrode and start from a first end portion of the gate electrode in plan view by implanting a first conductivity type impurity ion in a second direction, the first end portion of the gate electrode serving as the first mask end portion; and forming a second conductivity type fourth impurity region in the semiconductor layer that is located in the semiconductor layer and includes a portion that is under a second end portion of the gate electrode by implanting a second conductivity type impurity ion using the gate electrode as a mask, a second end portion of the gate electrode serving as a second mask end portion, wherein the second impurity region is in contact with the first impurity region and is formed in the semiconductor layer so as to extend under the gate electrode from the first end portion side, the first impurity region, the second impurity region, the third impurity region, and the semiconductor layer are located in the stated order from the outside of the gate electrode on the first end portion side toward the second end portion of the gate electrode in plan view, and impurity concentration of the first impurity region, the second impurity region, and the semiconductor layer decreases in the stated order, the first direction is a direction inclined relative to a vertical direction to a surface of the semiconductor layer, and the second direction is a direction closer to the vertical direction than the first direction is.

8. The solid-state imaging device according to claim 1, wherein the second conductivity type third impurity region is in direct contact with a lower portion and a side portion of the first conductivity type second impurity region.

* * * * *